United States Patent [19]

Noguchi

[11] 4,143,390

[45] Mar. 6, 1979

[54] SEMICONDUCTOR DEVICE AND A LOGICAL CIRCUIT FORMED OF THE SAME

[75] Inventor: Hideo Noguchi, Yokohama, Japan

[73] Assignee: Tokyo Shibaura Electric Co., Ltd., Kawasaki, Japan

[21] Appl. No.: 859,872

[22] Filed: Dec. 12, 1977

[30] Foreign Application Priority Data

Dec. 14, 1976 [JP] Japan .................................. 51-150204
Dec. 14, 1976 [JP] Japan .................................. 51-150205

[51] Int. Cl.² .............................................. H01L 27/02
[52] U.S. Cl. ........................................ 357/41; 357/45; 307/304
[58] Field of Search ............................. 357/41, 23, 45; 307/304

[56] References Cited

U.S. PATENT DOCUMENTS

| | | |
|---|---|---|
| 3,744,036 | 7/1973 | Frohman-Bentchkowsky .... 340/173 |
| 3,914,855 | 10/1975 | Cheney ................................. 29/571 |
| 4,045,811 | 8/1977 | Dingwall ............................... 357/41 |

OTHER PUBLICATIONS

Kawagoe et al., *IEEE Journal of Solid State Circuits*, vol. Sc-11, No. 3, June 1976.

*Primary Examiner*—Martin H. Edlow

*Attorney, Agent, or Firm*—Finnegan, Henderson, Farabow & Garrett

[57] ABSTRACT

A plurality of N-type first regions are formed in matrix arrangement on a P-type semiconductor substrate, and a plurality of N-type second regions are respectively formed on first portions of the P-type semiconductor substrate which are positioned between the N-type first regions along each of the rows of the matrix arrangement. Depletion-type MOS transistors are formed of the second regions each acting as a channel and the N-type first regions disposed on each side of the second regions and acting as a source and a drain, gate electrodes are respectively formed on the second regions and second portions of the P-type semiconductor substrate which are positioned between the second regions, along each of columns of the matrix arrangement of the N-type first regions, and enhancement-type MOS transistors are formed of the second portions of the substrate under the gate electrodes, each of which forms a channel and the second regions disposed on each side of these second portions, which act as a source and drain. That is, the channel regions of the depletion-type MOS transistors function as the source or drain regions of the enhancement-type MOS transistors, the depletion-type MOS transistors and enhancement-type MOS transistors being integrally formed with common regions.

11 Claims, 10 Drawing Figures

SEMICONDUCTOR DEVICE AND A LOGICAL CIRCUIT FORMED OF THE SAME

BACKGROUND OF THE INVENTION

This invention relates to a semiconductor device, more specifically to a semiconductor device with MOS field-effect transistors.

According to the conventional method, in forming a mask ROM, a plurality of source and drain regions are formed on a semiconductor substrate, gate insulating films or thick insulating films are selectively formed on the surfaces of portions of the semiconductor substrate forming channels between these source and drain regions, a plurality of input lines are respectively formed on these insulating films, and then an aluminium film for output line is formed with interposition of an insulating film composed of PSG (phospho silicate glass). When the output line aluminium film is connected with the drain regions of the MOS transistors formed on the semiconductor substrate, contact holes are respectively formed on these drain regions, and the output line is connected with the drain regions through these contact holes. According to such conventional mask ROM, the contact holes are required for connecting the output line with the MOS transistors, though the connection through the contact holes may often lead to disconnection of the output line, defective connection, etc., thereby reducing the yield rate. Furthermore, the contact holes will increase the chip area, preventing the reduction thereof.

SUMMARY OF THE INVENTION

Accordingly, an object of this invention is to provide a semiconductor device allowing the improvement of the yield as well as the reduction of the chip area.

According to the invention, there is provided a semiconductor device in which drain regions and source regions of depletion-type MOS transistors and channel regions between the drain and source regions are formed on a first-conductivity-type semiconductor substrate, and further enhancement-type MOS transistors having the sources and drains formed of the channel regions of the depletion-type MOS transistors are formed on the semiconductor substrate.

DETAILED DESCRIPTION OF THE PREFERRED EMBODIMENT

Figure 1:
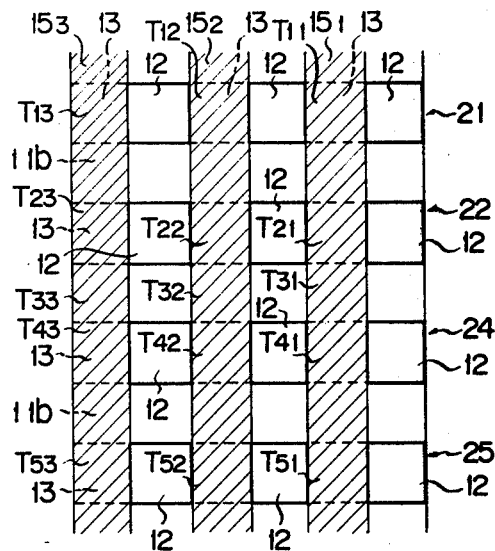
FIG. 1 is a plan view of the semiconductor substrate of the semiconductor device according to an embodiment of this invention.
Figure 2:
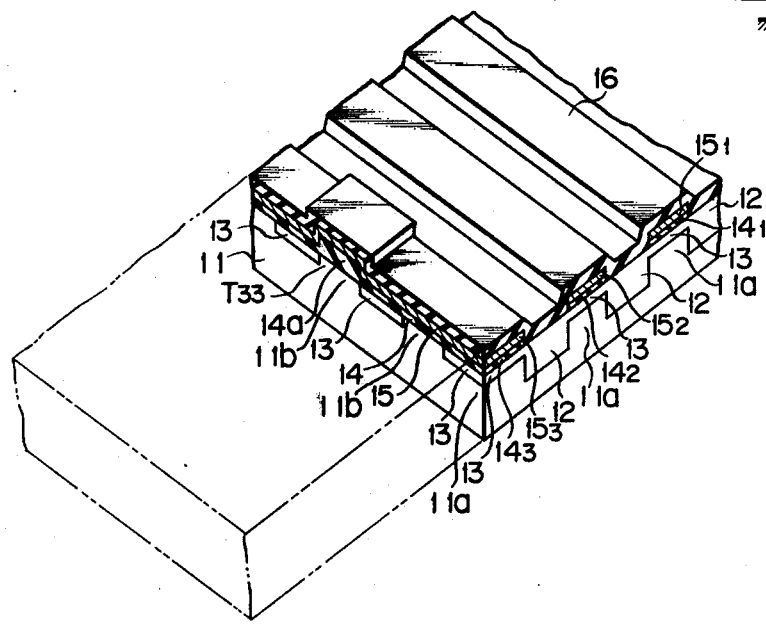
FIG. 2 is a perspective view of the semiconductor device of FIG. 1.

In an embodiment as shown in FIGS. 1 and 2, a plurality of N-type high-concentration regions or N+ first regions 12 are matrix-arranged on a P-type semiconductor substrate, e.g., P-type silicon substrate 11. A plurality of N-type second regions 13 are respectively formed on first portions 11a of the silicon substrate between the N+ regions 12 along the rows of these matrix-arranged N+ regions 12, that is, along the horizontal directions as in FIG. 1. These regions 13 are matrix-arranged in the same manner as the N+ regions 12. A plurality of gate insulating films $14_1$, $14_2$, $14_3$ ... are formed on the regions 13 and second portions of the silicon substrate which are positioned between the regions 13 along the columns of the matrix arrangement of the regions 13, that is, along the vertical directions as in FIG. 1. These gate insulating films $14_1$, $14_2$, $14_3$ ... have selectively thickened portions 14a at the second portions 11b of the silicon substrate between the regions 13. Further, gate electrode films $15_1$, $15_2$, $15_3$ ..., composed of polycrystalline silicon, are formed on the gate insulating films $14_1$, $14_2$, $14_3$ ... respectively. All over the silicon substrate 11, with the gate electrode films formed, is formed an insulating film 16 composed of phospho silicate glass (PSG).

According to the semiconductor device with the above construction, a depletion-type MOS transistor is composed of each second region 13 functioning as a channel and each two N+ first regions 12 adjoining both sides of the region 13 along each row of the matrix arrangement and functioning as a source and a drain respectively. On the other hand, an enhancement-type MOS transistor is composed of each second portion 11b of the silicon substrate 11 located between each two second regions 13 adjoining both sides of each second portion 11b along each column of the matrix arrangement of the regions 13. In this case, the regions 13 which are to form the channels of the depletion-type MOS transistors function as the source and drain of the enhancement-type transistor, while the second substrate portion 11b is used as the channel forming region in the enhancement-type transistor. Thus, a plurality of depletion-type MOS transistors are composed of the N+ regions 12 and channel regions 13 alternately disposed along the row, while a plurality of enhancement-type MOS transistors are composed of second substrate portions 11b and the regions 13 being identical with the channel regions of the depletion-type MOS transistors. Among the enhancement-type MOS transistors those transistors which have the thickened insulating films 14a are inoperative transistors. By selectively forming these inoperative transistors, that is, the thickened gate insulating films 14a, there may be composed a read-only memory (ROM) with desired memory information.

Figure 3:
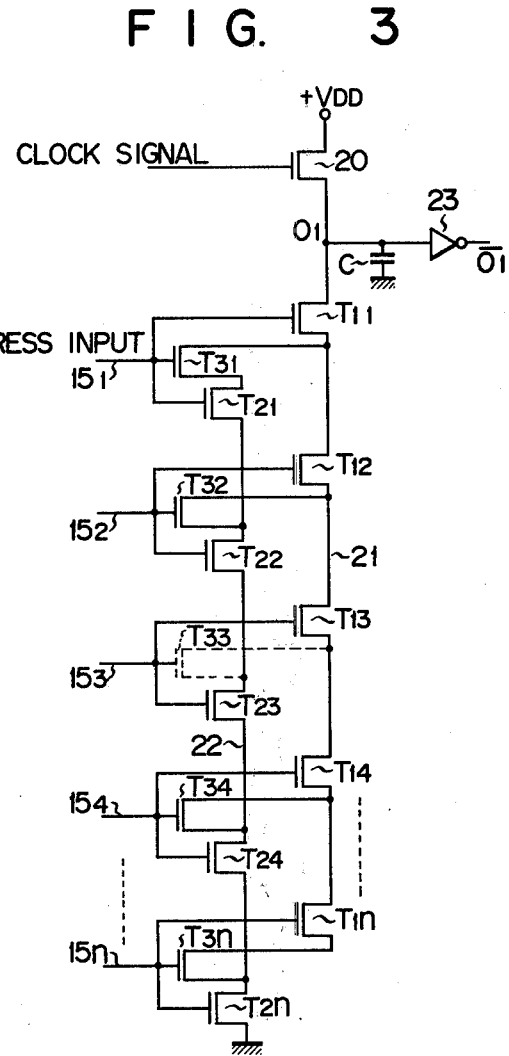
FIG. 3 is an equivalent circuit diagram of the semiconductor device of FIGS. 1 and 2.

Meanwhile, the above-mentioned semiconductor device has such circuit composition as shown in FIG. 3, for example. In FIG. 3 a series circuit 21 of depletion-type MOS transistors $T_{11}$, $T_{12}$, $T_{13}$, $T_{14}$ ... and $T_{1n}$, which is formed along the row as in FIG. 1, is connected with a power source $V_{DD}$ through an enhancement-type N-channel transistor (loaded MOS FET) 20 whose gate is supplied with clock signals. A series circuit 22 of depletion-type MOS transistors $T_{21}$, $T_{22}$, $T_{23}$, $T_{24}$ ... and $T_{2n}$ is earthed. Enhancement-type MOS transistors $T_{31}$, $T_{32}$, $T_{33}$, $T_{34}$ ... and $T_{3n}$ are connected across the respective two transistors of the series circuits 21 and 22. Further, the series circuit 21 transmits a readout output for the ROM composed of the semiconductor device, through an inverter 23. Meanwhile, depletion-type MOS transistors $T_{41}$, $T_{42}$, $T_{43}$ ... as shown in FIG. 1 form a circuit 24 for the adjoining output line, while subsequent depletion-type MOS transistors $T_{51}$, $T_{52}$, $T_{53}$ ... form a circuit 25 for the further adjoining output line. If a plurality of these output line circuits are available, the earthed output line circuit 22 may be used as the earth pole for the remaining circuits 21, 24 and 25. Alternatively, when the output line circuit 21 composed of the transistors $T_{11}$ to $T_{1n}$ and the output line circuit 22 composed of the transistors $T_{21}$ to $T_{2n}$ are used as a pair circuit and the output line circuit 24 composed of the transistors $T_{41}$, $T_{42}$ . . . and the output circuit 25 composed of the transistors $T_{51}$, $T_{52}$ . . . are used as another pair circuit, either one of the output line circuits of each pair circuit may be earthed. In this case, enhancement-type MOS transistors, such as transistors $T_{31}$, $T_{32}$, $T_{33}$ . . . that are formed between two output line circuits adjoining between one pair circuit and another pair circuit need not be operated, so that the gate insulating films of these enhancement-type transistors are thickened. In the embodiment as shown in FIG. 2 the enchancement-type transistor $T_{33}$ has a thick gate insulating film 14a, so it is indicated by a dotted line in the circuit of FIG. 3 for illustrating its inoperativeness.

Since the circuits of FIG. 3 form an ROM, a plurality of circuits of FIG. 3 are arranged in parallel with one another, and a plurality of ROM's may be formed in one chip by commonly connecting the gate electrodes of the respectively corresponding enhancement-type MOS transistors among these circuits. Here a capacitor C of FIG. 3 is a capacity being parasitically produced at the output terminal of the ROM.

Figure 4:
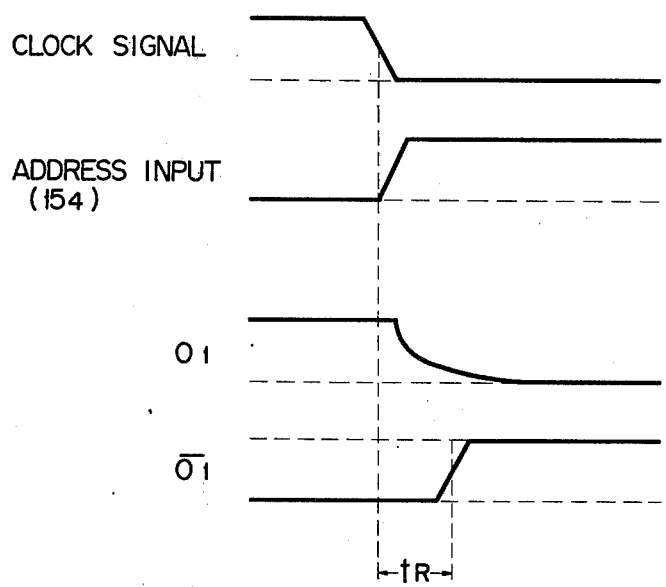
FIG. 4 is a timing chart of the circuit of FIG. 3 at operation.

In the circuits as shown in FIG. 3, when a clock signal is supplied to the gate of the transistor 20, the transistor 20 is turned ON and the capacitor C is charged. When in this state an address signal is supplied to e.g. an input line $15_4$ and the clock signal is at the same time brought to the OFF level, the transistor $T_{34}$ is turned ON. Consequently, if other input lines $15_1$ to $15_3$ and $15_5$ to $15_n$ are supplied with no address signals, the capacitor C is discharged through the transistors $T_{11}$, $T_{12}$, $T_{13}$, $T_{14}$, $T_{34}$, $T_{24}$ . . . and $T_{2n}$. FIG. 4 shows a timing chart illustrative of the above operation. Subsequently, if the address signal is supplied to the input line $15_3$, then the capacitor C is not discharged and the level of the supply voltage $V_{DD}$ is maintained, as the transistor $T_{33}$ connected with the input line $15_3$ does never operate because of its gate having the thick insulating film.

Now there will be described the method for manufacturing the semiconductor device to compose the ROM as stated above.

Figure 5A:
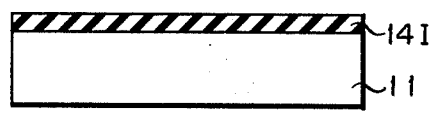
FIGS. 5A to 5F are sectional views of the semiconductor structure in the respective steps for manufacturing the semiconductor device according to the embodiment of the invention.
Figure 5B:
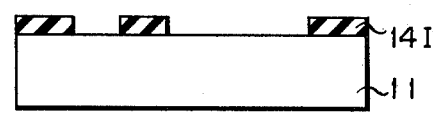
Figure 5C:
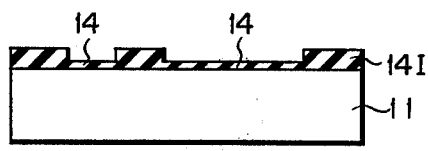
Figure 5D:
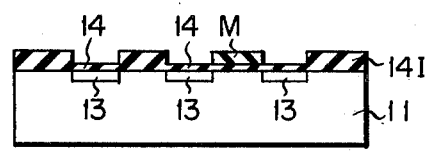
Figure 5E:
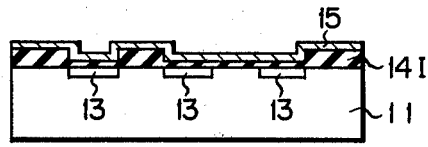
Figure 5F:
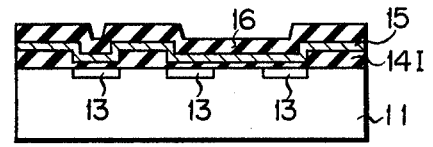

First, as shown in FIG. 5A, an insulating film 14 (e.g., SiO$_2$ film) 8,000 to 15,000Å thick is formed on a P-type silicon substrate 11 by the thermal oxidation or low-temperature vapor growth method. In the step of FIG. 5B portions of the insulating film 14 facing the regions on which the elements to compose the ROM, such as lead wire and transistor, are formed are removed with a photo-resist used as a mask. A thin gate insulating film 14 500 to 1,200Å is formed on the exposed surface of the silicon substrate 11 cleared of the insulating film by the thermal oxidation method, as shown in FIG. 5C. In the step of FIG. 5D a photo-resist M is formed on a portion of the insulating film 14 facing the region to form the gate region, i.e., channel of the enhancement-type MOS transistor. With this photo-resist M used as a mask, an N-type impurity, such as P$^+$ ion, is injected into the silicon substrate 11 by the ion implantation method, thus forming regions 13 to form the source or drain of the enhancement-type as well as the channel of the depletion-type MOS transistor. Subsequently, after the photo-resist M is removed, a polycrystalline silicon film 15 to form the input lines and the gate electrodes of the enhancement- and depletion-type MOS transistors is formed by the vapor growth method and patterning, as shown in FIG. 5E. Then, with this polycrystalline silicon film used as a mask, etching treatment is conducted to remove the unnecessary portions of the thin insulating film 14, and a step for forming the diffusion regions 12 shown in FIG. 1, for example, phosphor diffusion step. As shown in FIG. 5F, thereafter, a protective film 16 composed of e.g. PSG is formed on the silicon substrate and polycrystalline silicon film by the vapor growth method. Going through all these steps, there is manufactured the semiconductor device as shown in FIG. 2.

Although the semiconductor device according to the above embodiment is so constructed as to function as an ROM, it may also be so formed as to compose a conventional NOR circuit or the like, by forming the transistor $T_{33}$ in the circuit of FIG. 3 into an enhancement-type MOS transistor capable of operating in the same manner as the transistors $T_{31}$, $T_{32}$, $T_{33}$, $T_{34}$ . . . and $T_{3n}$. Further, the address input lines $15_1$ to $15_n$, which are formed of polycrystalline silicon in this embodiment, may otherwise be formed of metal such as aluminium. Moreover, the ion implantation for forming the channel regions of the depletion-type MOS transistors may be performed after the formation of the polycrystalline silicon film though it is made before such formation according to the aforesaid procedure. In this case, however, the ion acceleration voltage requires to be increased. Since a number of depletion-type MOS transistors are used in the circuits of FIG. 3, the discharge time $t_R$ is relatively long as shown in FIG. 4, so that the semiconductor device of the invention may not be easily applied to those ROM's which require high-speed operation. The semiconductor device of the invention may suitably compose a high-speed operating ROM, however, if the address input is dispersed, that is, the ouput power of the ROM is made common by providing a plurality of address input line blocks, each composed of a reduced number of address input lines in FIG. 3, thereby forming a circuit equivalent to the one shown in FIG. 3. The regions forming the depletion-type and enhancement-type MOS transistor may be selectively functional as passive elements such as resistors.

According to this invention, as described above, no contact holes are required to be provided for the circuit portions to perform the logical operations, so that there may be prevented the disconnection of wiring or defective contact which used to be caused in the prior art circuits. Moreover, the elimination of the contact holes may reduce the chip area by 25% as compared with the prior art semiconductor devices which require the contact holes. Thus, there may be composed a logical circuit device to secure the improvement of the yield as well as the increase of the integration density.

What is claimed is:

1. A semiconductor device comprising: a plurality of depletion-type MOS transistors having source, drain and channel regions and at least one enhancement-type MOS transistor having source and drains regions formed of the channel regions of the depletion-type MOS transistor and a channel region.

2. A semiconductor device, comprising: a first-conductivity-type semiconductor substrate; a plurality of first regions formed in matrix arrangement on said semiconductor substrate and having a second-conductivity-type opposite to that of said substrate; a plurality of second-conductivity-type second regions formed on first portions of said semiconductor substrate between said first regions along the rows of the matrix arrangement of said second-conductivity-type first regions and arranged in the shape of a matrix; a plurality of gate insulating films formed, along the columns of the matrix arrangement of said second regions, on said second regions and second portions of said semiconductor substrate which are positioned between said second regions along the columns of the matrix arrangement, said gate insulating films having thick portions which are selectively formed on said second portions of said semiconductor substrate; and a plurality of conductive films respectively formed on said gate insulating films; said first regions and said second regions alternately disposed along said line composing at least one depletion-type MOS transistor, and said second regions and said second portions of the semiconductor substrate alternately disposed along said column composing at least one enhancement-type MOS transistor, said second regions functioning as a source and a drain of said enhancement-type MOS transistor as well as a channel of said depletion-type MOS transistor.

3. A semiconductor device according to claim 1, wherein said second-conductivity-type first regions include at least first and second first-regions formed along a first row of the matrix arrangement and at least first and second first-regions formed along a second row of the matrix arrangement, said second-conductivity-type second-regions include first second-region formed between said first and second first-regions along said first row and second-region formed between said first and second first-region along said second row, said first and second first-regions along said first row and said first second-region compose a depletion-type MOS transistor, and said first and second second-regions and said second portion of the substrate between said first and second second-regions compose an enhancement-type MOS transistor.

4. A semiconductor device, comprising: a first-conductivity-type semiconductor substrate; a plurality of first regions formed in matrix arrangement on said semiconductor substrate and having a second-conductivity-type opposite to that of said substrate; a plurality of second-conductivity-type second regions formed on first portions of said semiconductor substrate between said first regions along the a plurality of rows of the matrix arrangement of said second-conductivity-type first regions and arranged in the shape of a matrix; a plurality of gate insulating films formed, along a plurality of columns of the matrix arrangement of said second regions, on said regions and second portions of said semiconductor substrate which are positioned between said second regions along the columns of the matrix arrangement, said gate insulating films having thick portions which are selectively formed on said second portions of said semiconductor substrate; and a plurality of conductive films respectively formed on said gate insulating films; said first regions and said second regions alternately disposed along said line compositing a plurality of depletion-type MOS transistors, and said second regions and said second portions of the semiconductor substrate alternately disposed along said column composing a plurality of enhancement-type MOS transistors, said second regions functioning as sources and drains of said enhancement-type MOS transistors as well as channels of said depletion-type MOS transistors.

5. A semiconductor device according to claim 4, wherein said gate insulating films are formed of $SiO_2$.

6. A semiconductor device according to claim 4, wherein said conductive films are formed of polycrystalline silicon.

7. A semiconductor device according to claim 4, wherein a protective film is formed over the surface of said semiconductor device.

8. A semiconductor device according to claim 4, wherein said semiconductor substrate is formed of a P-type silicon substrate, and said first and second regions contain an N-type impurity.

9. A semiconductor device according to claim 4, wherein said gate insulating films include thin insulating films 500 to 1,200Å thick including selectively thick insulating portions 8,000 to 15,000Å.

10. A logical circuit, comprising: a first transistor series circuit composed of a plurality of first depletion-type MOS transistors having channel regions and formed in series in a first line direction on a semiconductor substrate; a second transistor series circuit composed of a plurality of second depletion-type MOS transistors having channel regions and formed in series in a second line direction on said semiconductor substrate; a plurality of enhancement-type MOS transistors having sources and drains thereof formed of the respective channel regions of said first depletion-type MOS transistors in said first series circuit and the respective channel regions of said second depletion-type MOS transistors in said second series circuit, respectively, for selectively connecting said first MOS transistors in said first transistor series circuit with said second MOS transistors in said second transistor series circuit; and a plurality of input lines for supplying address signals respectively to a plurality of transistor groups each composed of each corresponding ones among said first and second depression-type transistors and said enhancement-type transistors.

11. A logical circuit according to claim 10 which comprise a plurality of logical circuit blocks each composed of said first series circuit, said second series circuit, and a plurality of said enhancement-type MOS transistors for connecting said first and second series circuits.

* * * * *

UNITED STATES PATENT AND TRADEMARK OFFICE
CERTIFICATE OF CORRECTION

PATENT NO. : 4,143,390

DATED : March 6, 1979

INVENTOR(S) : HIDEO NOGUCHI

It is certified that error appears in the above-identified patent and that said Letters Patent are hereby corrected as shown below:

Column 5, line 32, after "and" add -- second --.

line 52, after "said" in first occurrence add -- second --.

Column 6, line 4, word "compositing" should be -- composing --.

Signed and Sealed this

Fifth Day of August 1980

[SEAL]

Attest:

SIDNEY A. DIAMOND

Attesting Officer     Commissioner of Patents and Trademarks